United States Patent

Shen et al.

(10) Patent No.: US 10,009,146 B2
(45) Date of Patent: Jun. 26, 2018

(54) POLAR CODE RATE MATCHING METHOD AND RATE MATCHING APPARATUS

(71) Applicant: Huawei Technologies Co., Ltd., Shenzhen (CN)

(72) Inventors: Hui Shen, Shenzhen (CN); Bin Li, Shenzhen (CN); Jun Chen, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days. days.

(21) Appl. No.: 15/269,553

(22) Filed: Sep. 19, 2016

(65) Prior Publication Data

US 2017/0005753 A1 Jan. 5, 2017

Related U.S. Application Data

(63) Continuation of application No. PCT/CN2014/073719, filed on Mar. 19, 2014.

(51) Int. Cl.
*H04L 1/00* (2006.01)
*H03M 13/27* (2006.01)
(Continued)

(52) U.S. Cl.
CPC .......... *H04L 1/0067* (2013.01); *H03M 13/13* (2013.01); *H03M 13/2739* (2013.01);
(Continued)

(58) Field of Classification Search
CPC .......... H03M 13/2792; H03M 13/635; H03M 13/13; H03M 13/2957; H03M 13/2739;
(Continued)

(56) References Cited

U.S. PATENT DOCUMENTS

2008/0307293 A1* 12/2008 Cheng ................ H03M 13/23
714/790
2009/0049359 A1 2/2009 Malladi et al.
(Continued)

FOREIGN PATENT DOCUMENTS

CN 101119182 A 2/2008
CN 101159513 A 4/2008
(Continued)

OTHER PUBLICATIONS

Sun et al., "Interleavers for turbo codes using permutation polynomials over integer rings," in IEEE Transactions on Information Theory, vol. 51, No. 1, pp. 101-119, Jan. 2005.*
(Continued)

*Primary Examiner* — Michelle M Koeth
(74) *Attorney, Agent, or Firm* — Leydig, Voit & Mayer, Ltd.

(57) ABSTRACT

A Polar code rate matching method and a rate matching apparatus are disclosed. The method includes: dividing a system Polar code output by a Polar code encoder into system bits and parity bits; interleaving the system bits to obtain a first group of interleaved bits, and interleaving the parity bits to obtain a second group of interleaved bits; and determining a rate-matched output sequence based on the first group of interleaved bits and the second group of interleaved bits. System bits and parity bits are separately interleaved, to obtain a rate-matched output sequence, so that a sequence structure after interleaving is more random, which can reduce an FER, thereby improving HARQ performance, and ensuring reliability of data transmission.

2 Claims, 5 Drawing Sheets

(51) Int. Cl.
*H04L 1/18* (2006.01)
*H03M 13/13* (2006.01)
*H03M 13/00* (2006.01)
*H04W 28/14* (2009.01)

(52) U.S. Cl.
CPC ... *H03M 13/6306* (2013.01); *H03M 13/6362* (2013.01); *H04L 1/0041* (2013.01); *H04L 1/0057* (2013.01); *H04L 1/0061* (2013.01); *H04L 1/0068* (2013.01); *H04L 1/0071* (2013.01); *H04L 1/1812* (2013.01); *H04L 1/1819* (2013.01); *H04L 1/1867* (2013.01); *H04L 1/1835* (2013.01); *H04W 28/14* (2013.01)

(58) Field of Classification Search
CPC .......... H03M 13/6306; H03M 13/6362; H04L 1/0071; H04L 1/0067; H04L 1/0061; H04L 1/1812; H04L 1/0041; H04L 1/0057; H04L 1/0068; H04L 1/1819; H04L 1/1867; H04L 1/1835; H04W 28/14
See application file for complete search history.

(56) References Cited

U.S. PATENT DOCUMENTS

| | | | | |
|---|---|---|---|---|
| 2009/0086849 | A1* | 4/2009 | Tsai | H04L 1/1819 375/298 |
| 2009/0147724 | A1 | 6/2009 | Nimbalker et al. | |
| 2009/0327843 | A1 | 12/2009 | Palanki et al. | |
| 2011/0060963 | A1* | 3/2011 | Neeman | H03M 13/2739 714/755 |
| 2014/0019820 | A1* | 1/2014 | Vardy | H03M 13/13 714/752 |
| 2015/0077277 | A1* | 3/2015 | Alhussien | H03M 13/618 341/67 |

FOREIGN PATENT DOCUMENTS

| | | | |
|---|---|---|---|
| CN | 101442383 | A | 5/2009 |
| CN | 101557283 | A | 10/2009 |
| WO | WO 2008119048 | A2 | 10/2008 |

OTHER PUBLICATIONS

Bockelman, "Generator Matrices and Parity Check Matrices", Univeristy of Nebraska—Lincoln Department of Mathematics Website, (available at: "http://pi.uni.edu/~s-bbockel1/coding-notes/node3.html", last referenced Sep. 5, 2017), pp. 1-4, Jun. 29, 2005.*

Takeshita et al., "New Classes of Algebraic Interleavers for Turbo-Codes," IEEE International Symposium of Information Theory, Cambridge, MA, XP10296847A, pp. 419, Institute of Electrical and Electronics Engineers, New York, New York (Aug. 16-21, 1998).

Takeshita et al., "New Deterministic Interleaver Designs for Turbo Codes," IEEE Transactions on Information Theory, vol. 46, No. 6, pp. 1988-2006, XP11027753A, Institute of Electrical and Electronics Engineers, New York, New York, (Sep. 2000).

Arikan, "Systematic Polar Coding," IEEE Communications Letters, vol. 15, No. 8, pp. 860-862, XP11380828A, Institute of Electrical and Electronics Engineers, New York, New York, (Aug. 2011).

Arikan, "Channel polarization: A method of constructing capacity-achieving codes of symmetric binary-input memoryless channels," IEE, Institute of Electrical and Electronics Engineers, New York, New York, (Jul. 20, 2009).

Tal et al., "List Decoding of Polar Codes," IEEE Transactions on Information Theory, vol. 61, No. 5, pp. 2213-2226, Institute of Electrical and Electronics Engineers, New York, New York, (May 2015).

Cadambe et al., "Interference Alignment and Spatial Degrees of Freedom for the K User Interference Channel," IEEE International Conference on Communications, pp. 971-975, Institute of Electrical and Electronics Engineers, New York, New York, (2008).

* cited by examiner

POLAR CODE RATE MATCHING METHOD AND RATE MATCHING APPARATUS

CROSS-REFERENCE TO RELATED APPLICATIONS

This application is a continuation of International Application No. PCT/CN2014/073719, filed on Mar. 19, 2014. The disclosure of the above application is incorporated herein by reference.

TECHNICAL FIELD

Embodiments of the present invention relate to the codec field, and in particular, to a polar code rate matching method and a rate matching apparatus.

BACKGROUND

In a communications system, channel encoding is generally performed to improve reliability of data transmission and ensure quality of communication. A Polar code (polar code) is an encoding manner that can achieve a Shannon capacity and has low coding-decoding complexity. The Polar code is a linear block code. A generator matrix of the polar code is $G_N$, and an encoding process of the polar code is $x_1^N = u_1^N G_N$. For example $G_N = B_N F^{\otimes n}$, a code length is $N=2^n$, and $n \geq 0$.

Herein, $$F = \begin{bmatrix} 1 & 0 \\ 1 & 1 \end{bmatrix},$$

and $B_N$ is a transposed matrix, for example, a bit reversal (bit reversal) matrix.

$F^{\otimes n}$ is a Kronecker power (Kronecker power) of F, defined as $F^{\otimes n} = F \otimes F^{\otimes (n-1)}$. The Polar code may be represented by a coset code (N, K, A, $u_{A^c}$), and an encoding process of the polar code is: $x_1^N = u_A G_N(A) \oplus u_{A^c} G_N$. Herein A is a set of information (information) bit indexes, $G_N(A)$ is a sub-matrix obtained by using a row corresponding to an index in the set A in $G_N$, and $G_N(A^C)$ is a sub-matrix obtained by using a row corresponding to an index in a set $A^C$ in $G_N$. $u_{A^c}$ is frozen (frozen) bits, where a quantity of the frozen bits is (N−K), and the frozen bits are known bits. For simplicity, these frozen bits may be set to 0.

A conventional random (quasi-random) puncturing hybrid automatic repeat request (HARQ, Hybrid Automatic Repeat Request) technology may be used for the Polar code. The random (quasi-random) puncturing is randomly (quasi-randomly) selecting a position for puncturing. On a receive end, an LLR at a puncturing position is set to 0, a mother code decoding module and method are still used. In the random (quasi-random) puncturing manner, a frame error rate is relatively high, and HARQ performance is relatively poor.

SUMMARY

Embodiments of the present invention provide a Polar code rate matching method and a rate matching apparatus, which can improve HARQ performance of a Polar code.

According to a first aspect, a Polar code rate matching method is provided, including: dividing a system Polar code output by a Polar code encoder into system bits and parity bits; interleaving the system bits to obtain a first group of interleaved bits, and interleaving the parity bits to obtain a second group of interleaved bits; and determining a rate-matched output sequence based on the first group of interleaved bits and the second group of interleaved bits.

With reference to the first aspect, in an implementation manner of the first aspect, the interleaving the system bits to obtain a first group of interleaved bits includes: performing quadratic interleaving on the system bits to obtain the first group of interleaved bits.

With reference to the first aspect and the foregoing implementation manner of the first aspect, in another implementation manner of the first aspect, the interleaving the parity bits to obtain a second group of interleaved bits includes: performing Quadratic interleaving on the parity bits to obtain the second group of interleaved bits.

With reference to the first aspect and the foregoing implementation manners of the first aspect, in another implementation manner of the first aspect, the determining a rate-matched output sequence based on the first group of interleaved bits and the second group of interleaved bits includes: sequentially writing the first group of interleaved bits and the second group of interleaved bits to a circular buffer; determining a start position of the rate-matched output sequence in the circular buffer according to a redundancy version; and reading the rate-matched output sequence from the circular buffer according to the start position.

With reference to the first aspect and the foregoing implementation manners of the first aspect, in another implementation manner of the first aspect, the determining a rate-matched output sequence based on the first group of interleaved bits and the second group of interleaved bits includes: sequentially combining the first group of interleaved bits and the second group of interleaved bits into a third group of interleaved bits; and sequentially clipping or repeatedly extracting bits from the third group of interleaved bits to obtain the rate-matched output sequence.

According to a second aspect, a rate matching apparatus is provided, including: a grouping unit, configured to divide a system Polar code output by a polar Polar code encoder into system bits and parity bits; an interleaving unit, configured to interleave the system bits to obtain a first group of interleaved bits, and interleave the parity bits to obtain a second group of interleaved bits; and a determining unit, configured to determine a rate-matched output sequence based on the first group of interleaved bits and the second group of interleaved bits.

With reference to the second aspect, in an implementation manner of the second aspect, the interleaving unit is specifically configured to perform quadratic interleaving on the system bits to obtain the first group of interleaved bits, and/or perform Quadratic interleaving on the parity bits to obtain the second group of interleaved bits.

With reference to the second aspect and the foregoing implementation manner of the second aspect, in another implementation manner of the second aspect, the determining unit is specifically configured to sequentially write the first group of interleaved bits and the second group of interleaved bits to a circular buffer, determine a start position of the rate-matched output sequence in the circular buffer according to a redundancy version, and read the rate-matched output sequence from the circular buffer according to the start position.

With reference to the second aspect and the foregoing implementation manners of the second aspect, in another implementation manner of the second aspect, the determining unit is specifically configured to sequentially combine the first group of interleaved bits and the second group of interleaved bits into a third group of interleaved bits, and sequentially clip or repeatedly extract bits from the third group of interleaved bits to obtain the rate-matched output sequence.

According to a third aspect, a wireless communications apparatus is provided, including a polar Polar code encoder, the rate matching apparatus described above, and a transmitter.

According to the embodiments of the present invention, system bits and parity bits are separately interleaved, to obtain a rate-matched output sequence, so that a sequence structure after interleaving is more random, which can reduce an FER (Frame Error Rate), thereby improving HARQ performance, and ensuring reliability of data transmission.

BRIEF DESCRIPTION OF DRAWINGS

To describe the technical solutions in the embodiments of the present invention more clearly, the following briefly introduces the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

Figure 1:
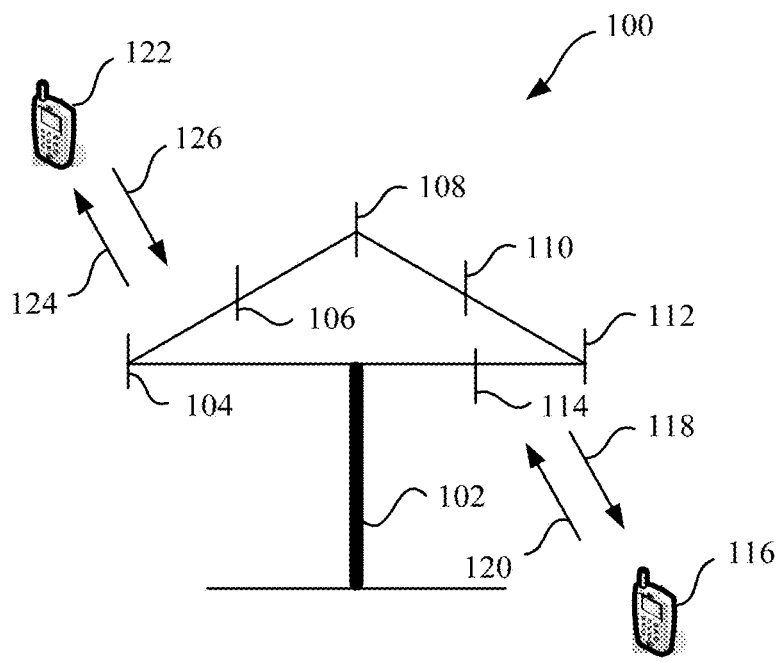
FIG. 1 shows a wireless communications system according to an embodiment of the present invention.

The following clearly and completely describes the technical solutions in the embodiments of the present invention with reference to the accompanying drawings in the embodiments of the present invention. Apparently, the described embodiments are some but not all of the embodiments of the present invention. All other embodiments obtained by a person of ordinary skill in the art based on the embodiments of the present invention without creative efforts shall fall within the protection scope of the present invention.

Terminologies such as "component", "module", and "system" used in this specification are used to indicate computer-related entities, hardware, firmware, combinations of hardware and software, software, or software being executed. For example, a component may be, but is not limited to, a process that runs on a processor, a processor, an object, an executable file, a thread of execution, a program, and/or a computer. As shown in figures, both a computing device and an application that runs on a computing device may be components. One or more components may reside within a process and/or a thread of execution, and a component may be located on one computer and/or distributed between two or more computers. In addition, these components may be executed from various computer-readable media that store various data structures. For example, the components may communicate by using a local and/or remote process and according to, for example, a signal having one or more data packets (for example, data from two components interacting with another component in a local system, a distributed system, and/or across a network such as the Internet interacting with other systems by using the signal).

In addition, the embodiments are described with reference to an access terminal. An access terminal may also be referred to as a system, a subscriber unit, a subscriber station, a mobile station, a mobile, a remote station, a remote terminal, a mobile device, a user terminal, a terminal, a wireless communications device, a user agent, a user apparatus, or UE (User Equipment). The access terminal may be a cellular phone, a cordless phone, a SIP (Session Initiation Protocol) phone, a WLL (Wireless Local Loop) station, a PDA (Personal Digital Assistant), a handheld device having a wireless communication function, a computing device, or another processing device connected to a wireless modem. In addition, the embodiments are described with reference to a base station. A base station can be used to communicate with a mobile device; and the base station may be a BTS (Base Transceiver Station) in GSM (Global System of Mobile communication,) or CDMA (Code Division Multiple Access); or may be an NB (NodeB) in WCDMA (Wideband Code Division Multiple Access); or may be an eNB or eNodeB (Evolutional Node B) in LTE (Long Term Evolution), a relay station or an access point, a base station device in a future 5G network, or the like.

In addition, aspects or features of the present invention may be implemented as a method, an apparatus or a product that uses standard programming and/or engineering technologies. The term "product" used in this application covers a computer program that can be accessed from any computer readable component, carrier or medium. For example, the computer-readable medium may include but is not limited to: a magnetic storage component (for example, a hard disk, a floppy disk or a magnetic tape), an optical disc (for example, a CD (Compact Disk), and a DVD (Digital Versatile Disk), a smart card and a flash memory component (for example, EPROM (Erasable Programmable Read-Only Memory), a card, a stick, or a key drive). In addition, various storage media described in this specification may indicate one or more devices and/or other machine-readable media that are used to store information. The term "machine readable media" may include but is not limited to a radio channel, and various other media that can store, contain and/or carry an instruction and/or data.

Now, refer to FIG. 1, which shows a wireless communications system 100 according to the embodiments of this specification. The system 100 includes a base station 102, where the latter may include multiple antenna groups. For example, an antenna group may include antennas 104 and 106, another antenna group may include antennas 108 and 110, and an additional group may include antennas 112 and 114. For each antenna group, two antennas are shown; however, more or less antennas may be used for each group. The base station 102 may additionally include a transmitter chain and a receiver chain, and a person of ordinary skill in the art may understand that both of them may include multiple components related to signal sending and receiving (for example, a processor, a modulator, a multiplexer, a demodulator, a demultiplexer, and an antenna).

The base station 102 may communicate with one or more access terminals (for example, an access terminal 116 and an access terminal 122). However, it may be understood that the base station 102 basically can communicate with any quantity of access terminals similar to the access terminals 116 and 122. The access terminals 116 and 122 may be, for example, a cellular phone, a smart phone, a portable computer, a handheld communications device, a handheld computing device, a satellite radio apparatus, a global positioning system, a PDA, and/or any other suitable device configured to perform communication in the wireless communications system 100. As shown in the figure, the access terminal 116 communicates with the antennas 112 and 114, where the antennas 112 and 114 send information to the access terminal 116 through a forward link 118, and receive information from the access terminal 116 through a reverse link 120. In addition, the access terminal 122 communicates with the antennas 104 and 106, where the antennas 104 and 106 send information to the access terminal 122 through a forward link 124, and receive information from the access terminal 122 through a reverse link 126. In an FDD (Frequency Division Duplex) system, for example, a frequency band different from that used for the reverse link 120 may be used for the forward link 118, and the forward link 124 may use a different frequency band from the reverse link 126. In addition, in a TDD (Time Division Duplex) system, a same frequency band may be used for the forward link 118 and the reverse link 120, and a same frequency band may be used for the forward link 124 and the reverse link 126.

Each antenna group and/or area designed for communication is referred to as a sector of the base station 102. For example, an antenna group may be designed to communicate with an access terminal in a sector of an area covered by the base station 102. During communication through the forward links 118 and 124, a transmit antenna of the base station 102 may improve, by means of beamforming, signal to noise ratios of the forward links 118 and 124 for the access terminals 116 and 122. In addition, compared with sending, by a base station by using a single antenna, information to all access terminals of the base station, sending, by the base station 102 by means of beamforming, information to the access terminals 116 and 122 that are dispersed randomly in a related coverage area causes less interference to a mobile device in a neighboring cell.

In a given time, the base station 102, the access terminal 116, and/or the access terminal 122 may be a sending wireless communications apparatus and/or a receiving wireless communications apparatus. When sending data, the sending wireless communications apparatus may encode the data for transmission. Specifically, the sending wireless communications apparatus may have (for example, generate, obtain, or store in a memory) a particular quantity of information bits to be sent to the receiving wireless communications apparatus through a channel. The information bits may be included in a transport block (or multiple transport blocks) of data, and the transport block may be segmented to produce multiple code blocks. In addition, the sending wireless communications apparatus may encode each code block by using a Polar code encoder (which is not shown).

Figure 2:
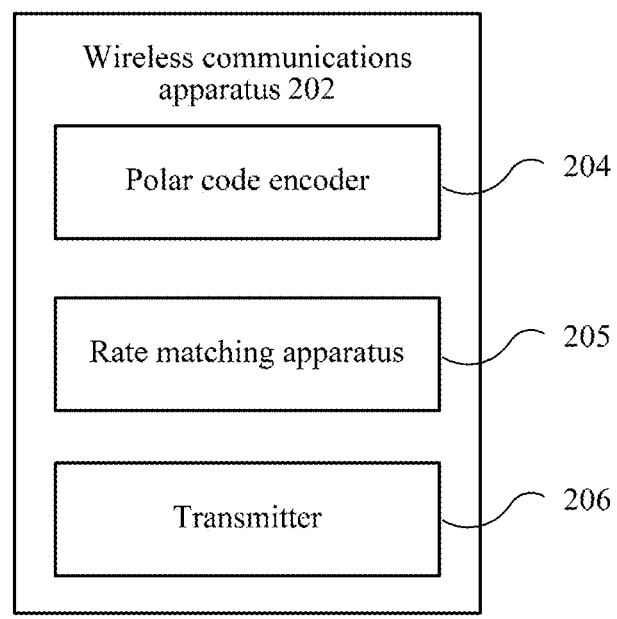
FIG. 2 shows a system for executing a Polar code processing method in a wireless communications environment.

Now, turn to FIG. 2, which shows a system 200 for executing a Polar code processing method in a wireless communications environment. The system 200 includes a wireless communications apparatus 202, where it is shown that the wireless communications apparatus 202 sends data through a channel. Although it is shown that the wireless communications apparatus 202 sends data, the wireless communications apparatus 202 may further receive data through a channel (for example, the wireless communications apparatus 202 may simultaneously send and receive data, the wireless communications apparatus 202 may send and receive data at different time points, or the two cases coexist). The wireless communications apparatus 202 may be, for example, a base station (for example, the base station 102 in FIG. 1) or an access terminal (for example, the access terminal 116 in FIG. 1 or the access terminal 122 in FIG. 1).

The wireless communications apparatus 202 may include a Polar code encoder 204, a rate matching apparatus 205, and a transmitter 206.

The Polar code encoder 204 is configured to encode data to be transferred to obtain a corresponding Polar code.

If the Polar code obtained after encoding by the Polar code encoder 204 is a system code, the rate matching apparatus 205 may be configured to divide the system Polar code output by the Polar code encoder 204 into system bits and parity bits, interleave the system bits to obtain a first group of interleaved bits, interleave the parity bits to obtain a second group of interleaved bits, and then determine a rate-matched output sequence based on the first group of interleaved bits and the second group of interleaved bits.

If the Polar code obtained after encoding by the Polar code encoder 204 is a non-system code, the rate matching apparatus 205 may be configured to perform integral interleaving on the non-system Polar code to obtain interleaved bits, and then determine a rate-matched output sequence based on the interleaved bits.

In addition, the transmitter 206 may subsequently transfer, on a channel, the rate-matched output sequence that is processed by the rate matching apparatus 205. For example, the transmitter 206 may send related data to another different wireless communications apparatus (which is not shown).

In this embodiment of the present invention, if the Polar code obtained after encoding by the Polar code encoder 204 is a system code, the Polar code may be referred to as a system Polar code. If the Polar code obtained after encoding by the Polar code encoder 204 is a non-system code, the Polar code may be referred to as a non-system Polar code.

Generally, the system code refers to a code whose generator matrix G is in the following form or an equivalent code thereof:

$G=[I_k, P]$, where $I_k$ is a $k^{th}$-order unit matrix, and P is a check matrix.

A code except the system code may be referred to as a non-system code.

Figure 3:
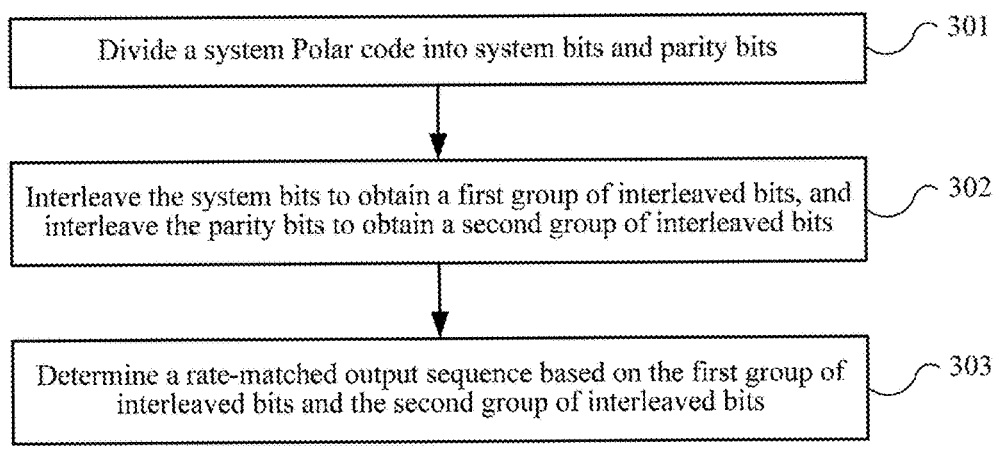
FIG. 3 is a flowchart of a Polar code rate matching method according to an embodiment of the present invention.

FIG. 3 is a flowchart of a Polar code rate matching method according to an embodiment of the present invention. The method in FIG. 3 is executed by a Polar code encoding and transmitting end (for example, the rate matching apparatus 205 shown in FIG. 2).

301: Divide a system Polar code into system bits and parity bits.

The system bits are bits corresponding to a unit matrix $I_k$ part in the foregoing generator matrix G, and the parity bits are bits corresponding to a check matrix P part in the foregoing generator matrix G.

302: Interleave the system bits to obtain a first group of interleaved bits (Set1), and interleave the parity bits to obtain a second group of interleaved bits (Set2).

303: Determine a rate-matched output sequence based on the first group of interleaved bits and the second group of interleaved bits.

According to this embodiment of the present invention, system bits and parity bits are separately interleaved, to obtain a rate-matched output sequence, so that a sequence structure after interleaving is more random, which can reduce an FER, thereby improving HARQ performance, and ensuring reliability of data transmission.

In addition, because impacts of interleaving processing on minimum distances of the system bits and the parity bits are different, when the system bits and the parity bits are separately interleaved, minimum distances of the interleaved bits can be further increased, thereby improving rate matching performance of the Polar code.

A type of the interleaving processing performed in step 302 is not limited in this embodiment of the present invention. For example, quadratic interleaving may be performed.

For a case in which N is an integer power of 2, a function is defined:

$$c(m) = \frac{km(m+1)}{2} (\bmod N),$$

where K is an odd number, and $0 \leq m < N$; and a mapping function of the Quadratic interleaving is: $c(m)$ a $c(m+1)$ (mod N) $0 \leq m < N$. In other words, the $c(m)^{th}$ bit is mapped onto the $c(m+1)(\bmod N)^{th}$ bit in interleaved bits. Herein mod is a modulo operation.

Optionally, in an embodiment, in step 302, when the system bits are interleaved to obtain the first group of interleaved bits, quadratic interleaving may be performed on the system bits to obtain the first group of interleaved bits.

Optionally, in another embodiment, in step 302, when the parity bits are interleaved to obtain the second group of interleaved bits, quadratic interleaving may be performed on the parity bits to obtain the second group of interleaved bits.

Optionally, in another embodiment, in step 303, when the rate-matched output sequence is determined based on the first group of interleaved bits and the second group of interleaved bits, a circular buffer may be used. Specifically, first, the first group of interleaved bits and the second group of interleaved bits may be sequentially written to the circular buffer, that is, the first group of interleaved bits is first written to the circular buffer, and then the second group of interleaved bits is written to the circular buffer. Then a start position of the rate-matched output sequence in the circular buffer may be determined according to a redundancy version (RV), and bits are read from the circular buffer according to the start position as the rate-matched output sequence.

In an HARQ process of the Polar code, the system bits and the parity bits are different in importance, and specifically, the system bits are more important than the parity bits. It is assumed that the first group of interleaved bits obtained by interleaving the system bits is Set1, and the second group of interleaved bits obtained by interleaving the parity bits is Set2. Set1 is written to the circular buffer before Set2, so that more system bits may be retained in the rate-matched output sequence, so as to improve HARQ performance of the Polar code.

Optionally, in another embodiment, in step 303, when the rate-matched output sequence is determined based on the first group of interleaved bits and the second group of interleaved bits, the first group of interleaved bits (Set1) and the second group of interleaved bits (Set2) may be sequentially combined into a third group of interleaved bits (Set3), that is, in Set3, all bits in Set1 are located before all bits in Set2. Then bits may be sequentially clipped or repeatedly extracted from Set3 to obtain the rate-matched output sequence required in each time of retransmission. For example, when a length La of bits that need to be retransmitted is shorter than a length Lb of Set3, some bits whose length is La are clipped from Set3 as the rate-matched output sequence. For another example, when a length La of bits that need to be retransmitted is longer than a length Lb of Set3, after all bits in Set3 are read, the bits in Set3 may be read second time from the beginning, which is repeated until the rate-matched output sequence whose length is La is read.

In an HARQ process of a Polar code, system bits and parity bits are different in importance, and specifically, the system bits are more important than the parity bits. Therefore, a first group of interleaved bits Set1 obtained by interleaving the system bits is located before a second group of interleaved bits Set2 obtained by interleaving the parity bits, which are combined into a third group of interleaved bits Set3, so that more system bits may be remained in a rate-matched output sequence that is obtained finally, thereby improving HARQ performance of the Polar code.

Figure 4:
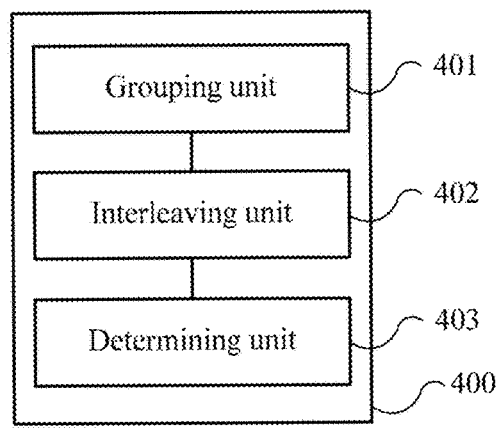
FIG. 4 is a block diagram of a rate matching apparatus according to an embodiment of the present invention.

FIG. 4 is a block diagram of a rate matching apparatus according to an embodiment of the present invention. The rate matching apparatus 400 in FIG. 4 may be located on a base station or user equipment, including a grouping unit 401, an interleaving unit 402, and a determining unit 403.

The grouping unit 401 divides a system Polar code into system bits and parity bits. The interleaving unit 402 interleaves the system bits to obtain a first group of interleaved bits, and interleaves the parity bits to obtain a second group of interleaved bits. The determining unit 403 determines a rate-matched output sequence based on the first group of interleaved bits and the second group of interleaved bits.

According to this embodiment of the present invention, system bits and parity bits are separately interleaved, to obtain a rate-matched output sequence, so that a sequence structure after interleaving is more random, which can reduce an FER, thereby improving HARQ performance, and ensuring reliability of data transmission.

In addition, because impacts of interleaving processing on minimum distances of the system bits and the parity bits are different, when the system bits and the parity bits are separately interleaved, minimum distances of the interleaved bits can be further increased, thereby improving rate matching performance of the Polar code.

A type of the interleaving processing performed by the interleaving unit 402 is not limited in this embodiment of the present invention. For example, the interleaving unit 402 may perform quadratic interleaving.

Optionally, in an embodiment, the interleaving unit 402 may perform quadratic interleaving on the system bits to obtain the first group of interleaved bits, and/or perform quadratic interleaving on the parity bits to obtain the second group of interleaved bits.

Optionally, in another embodiment, the determining unit 403 may sequentially write the first group of interleaved bits and the second group of interleaved bits to a circular buffer, determine a start position of the rate-matched output sequence in the circular buffer according to a redundancy version, and read the rate-matched output sequence from the circular buffer according to the start position.

In an HARQ process of the Polar code, the system bits and the parity bits are different in importance, and specifically, the system bits are more important than the parity bits. It is assumed that the first group of interleaved bits obtained by interleaving the system bits is Set1, and the second group of interleaved bits obtained by interleaving the parity bits is Set2. Set1 is written to the circular buffer before Set2, so that more system bits may be retained in the rate-matched output sequence, so as to improve HARQ performance of the Polar code.

Optionally, in another embodiment, the determining unit 403 may sequentially combine the first group of interleaved bits and the second group of interleaved bits into a third group of interleaved bits, and sequentially clip or repeatedly extract bits from the third group of interleaved bits, so as to obtain the rate-matched output sequence.

In an HARQ process of a Polar code, system bits and parity bits are different in importance, and specifically, the system bits are more important than the parity bits. Therefore, a first group of interleaved bits Set1 obtained by interleaving the system bits is located before a second group of interleaved bits Set2 obtained by interleaving the parity bits, which are combined into a third group of interleaved bits Set3, so that more system bits may be remained in a rate-matched output sequence that is obtained finally, thereby improving HARQ performance of the Polar code.

Figure 5:
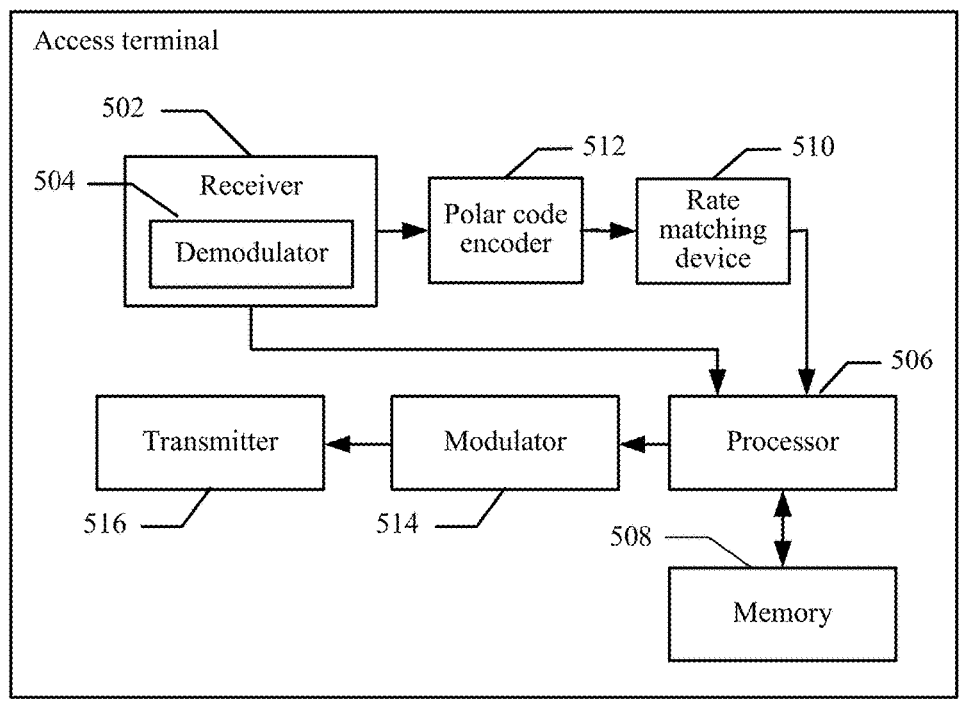
FIG. 5 is a schematic diagram of an access terminal that helps execute a Polar code processing method in a wireless communications system.

FIG. 5 is a schematic diagram of an access terminal 500 that helps execute the foregoing Polar code processing method in a wireless communications system. The access terminal 500 includes a receiver 502, where the receiver 502 is configured to receive a signal from, for example, a receive antenna (which is not shown), perform a typical operation (for example, filtering, amplification, or down-conversion) on the received signal, and digitize the adjusted signal to obtain a sample. The receiver 502 may be, for example, an MMSE (minimum mean square error, Minimum Mean-Squared Error) receiver. The access terminal 500 may further include a demodulator 504, where the demodulator 504 may be configured to demodulate received symbols and provide the symbols to a processor 506 for channel estimation. The processor 506 may be a processor specifically configured to analyze information received by the receiver 502 and/or generate information to be sent by a transmitter 516, a processor configured to control one or more components of the access terminal 500, and/or a controller configured to analyze information received by the receiver 502, generate information to be sent by the transmitter 516, and control one or more components of the access terminal 500.

The access terminal 500 may additionally include a memory 508, where the latter is operationally coupled to the processor 506, and stores the following data: data to be sent, received data, and any other suitable information related to execution of various operations and functions in this specification. The memory 508 may additionally store a protocol and/or an algorithm related to Polar code processing.

It may be understood that a data storage apparatus (for example, the memory 508) described in this specification may be a volatile memory or a non-volatile memory, or may include both a volatile memory and a non-volatile memory. It is exemplary rather than limitative that the non-volatile memory may include: a ROM (Read-Only Memory, read-only memory), a PROM (Programmable ROM, programmable read-only memory), an EPROM (Erasable PROM, erasable programmable read-only memory), an EEPROM (Electrically EPROM, electrically erasable programmable read-only memory), or a flash memory; and the volatile memory may include a RAM (Random Access Memory, random access memory), and is used as an external cache. RAMs in many forms such as an SRAM (Static RAM, static random access memory), a DRAM (Dynamic RAM, dynamic random access memory), an SDRAM (Synchronous DRAM, synchronous dynamic random access memory), a DDR SDRAM (Double Data Rate SDRAM, double data rate synchronous dynamic random access memory), an ESDRAM (Enhanced SDRAM, enhanced synchronous dynamic random access memory), an SLDRAM (Synchlink DRAM, synchlink dynamic random access memory), and a DR RAM (Direct Rambus RAM, direct rambus random access memory) may be used, which is an exemplary rather than limitative description. The memory 508 in the system and method described in this specification intends to include, but is not limited to, these memories and any other memory of a suitable type.

In actual application, the receiver 502 may be further coupled to a rate matching device 510. The rate matching device 510 may be basically similar to the rate matching apparatus 205 in FIG. 2. In addition, the access terminal 500 may further include a Polar code encoder 512. The Polar code encoder 512 is basically similar to the Polar code encoder 204 in FIG. 2.

If a system Polar code is obtained by encoding by the Polar code encoder 512, the rate matching device 510 may be configured to divide the system Polar code into system bits and parity bits; interleave the system bits to obtain a first group of interleaved bits (Set1), and interleave the parity bits to obtain a second group of interleaved bits (Set2); and determine a rate-matched output sequence based on the first group of interleaved bits and the second group of interleaved bits.

According to this embodiment of the present invention, system bits and parity bits are separately interleaved, to obtain a rate-matched output sequence, so that a sequence structure after interleaving is more random, which can reduce an FER, thereby improving HARQ performance, and ensuring reliability of data transmission.

In addition, because impacts of interleaving processing on minimum distances of the system bits and the parity bits are different, when the system bits and the parity bits are separately interleaved, minimum distances of the interleaved bits can be further increased, thereby improving rate matching performance of the Polar code.

On the other hand, if a non-system Polar code is obtained by encoding by the Polar code encoder 512, the rate matching device 510 may be configured to perform integral interleaving on the non-system Polar code to obtain interleaved bits, and determine a rate-matched output sequence based on the interleaved bits.

In this embodiment of the present invention, integral interleaving is performed on a non-system Polar code, and a minimum distance of interleaved bits is increased, thereby improving rate matching performance of the Polar code.

A type of the interleaving processing performed by the rate matching device 510 is not limited in this embodiment of the present invention. For example, quadratic (Quadratic) interleaving may be performed.

For a case in which N is an integer power of 2, a function is defined:

$$c(m) = \frac{km(m+1)}{2}(\bmod N),$$

where K is an odd number, and $0 \leq m < N$; and a mapping function of the Quadratic interleaving is: c(m) a c(m+1) (mod N) $0 \leq m < N$. In other words, the $c(m)^{th}$ bit is mapped onto the $c(m+1)(\bmod N)^{th}$ bit in interleaved bits. Herein mod is a modulo operation.

Optionally, in an embodiment, when interleaving the system bits to obtain the first group of interleaved bits, the rate matching device 510 may perform quadratic (Quadratic) interleaving on the system bits to obtain the first group of interleaved bits.

Optionally, in another embodiment, when interleaving the parity bits to obtain the second group of interleaved bits, the rate matching device 510 may perform quadratic (Quadratic) interleaving on the parity bits to obtain the second group of interleaved bits.

Optionally, in another embodiment, when determining the rate-matched output sequence based on the first group of interleaved bits and the second group of interleaved bits, the rate matching device 510 may use a circular buffer. Specifically, first, the rate matching device 510 may sequentially write the first group of interleaved bits and the second group of interleaved bits to the circular buffer, that is, the first group of interleaved bits is first written to the circular buffer, and then the second group of interleaved bits is written to the circular buffer. Then the rate matching device 510 may determine a start position of the rate-matched output sequence in the circular buffer according to a redundancy version, and read bits from the circular buffer according to the start position as the rate-matched output sequence.

In an HARQ process of the Polar code, the system bits and the parity bits are different in importance, and specifically, the system bits are more important than the parity bits. It is assumed that the first group of interleaved bits obtained by interleaving the system bits is Set1, and the second group of interleaved bits obtained by interleaving the parity bits is Set2. Set1 is written to the circular buffer before Set2, so that more system bits may be retained in the rate-matched output sequence, so as to improve HARQ performance of the Polar code.

Optionally, in another embodiment, when determining the rate-matched output sequence based on the first group of interleaved bits and the second group of interleaved bits, the rate matching device 510 may sequentially combine the first group of interleaved bits (Set1) and the second group of interleaved bits (Set2) into a third group of interleaved bits (Set3), that is, in Set3, all bits in Set1 are located before all bits in Set2. Then the rate matching device 510 may sequentially clip or repeatedly extract bits from Set3 to obtain the rate-matched output sequence required in each time of retransmission. For example, when a length La of bits that need to be retransmitted is shorter than a length Lb of Set3, some bits whose length is La are clipped from Set3 as the rate-matched output sequence. For another example, when a length La of bits that need to be retransmitted is longer than a length Lb of Set3, after all bits in Set3 are read, the bits in Set3 may be read second time from the beginning, which is repeated until the rate-matched output sequence whose length is La is read.

In an HARQ process of a Polar code, system bits and parity bits are different in importance, and specifically, the system bits are more important than the parity bits. Therefore, a first group of interleaved bits Set1 obtained by interleaving the system bits is located before a second group of interleaved bits Set2 obtained by interleaving the parity bits, which are combined into a third group of interleaved bits Set3, so that more system bits may be remained in a rate-matched output sequence that is obtained finally, thereby improving HARQ performance of the Polar code.

Optionally, in an embodiment, when performing integral interleaving on a non-system Polar code to obtain interleaved bits, the rate matching device 510 may perform quadratic (Quadratic) interleaving on the non-system Polar code to obtain the interleaved bits.

Optionally, in another embodiment, when determining the rate-matched output sequence based on the interleaved bits, the rate matching device 510 may write the interleaved bits to the circular buffer, determine a start position of the rate-matched output sequence in the circular buffer according to a redundancy version, and read the rate-matched output sequence from the circular buffer according to the start position.

Optionally, in another embodiment, when determining the rate-matched output sequence based on the interleaved bits, the rate matching device 510 may sequentially clip or repeatedly extract bits from the interleaved bits, so as to obtain the rate-matched output sequence required in each time of retransmission.

In addition, the access terminal 500 may further include a modulator 514 and the transmitter 516, where the transmitter 516 is configured to send a signal to, for example, a base station or another access terminal. Although it is shown that the Polar code encoder 512, the rate matching device 510, and/or the modulator 514 is separated from the processor 506, it may be understood that the Polar code encoder 512, the rate matching device 510, and/or the modulator 514 may be a part of the processor 506 or multiple processors (which are not shown).

Figure 6:
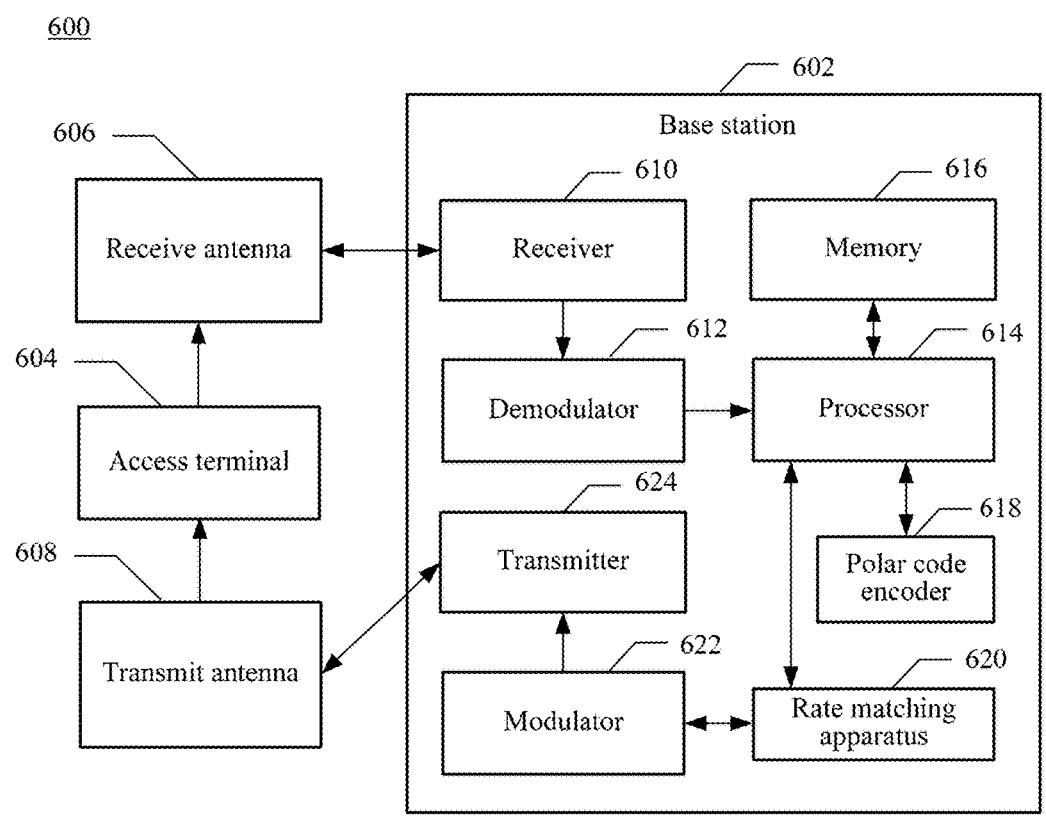
FIG. 6 is a schematic diagram of a system in which a Polar code processing method is executed in a wireless communications environment.

FIG. 6 is a schematic diagram of a system 600 in which the foregoing Polar code processing method is executed in a wireless communications environment. The system 600 includes a base station 602 (for example, an access point, a NodeB, or an eNB), where the base station 602 has a receiver 610 that receives signals from one or more access terminals 604 by using multiple receive antennas 606, and a transmitter 624 that transmits signals to the one or more access terminals 604 by using a transmit antenna 608. The receiver 610 may receive information from the receive antennas 606, and is operationally associated to a demodulator 612 that demodulates the received information. A demodulated symbol is analyzed by a processor 614 similar to the processor described in FIG. 7, the processor 614 is connected to a memory 616, and the memory 616 is configured to store data to be sent to the access terminal 604 (or a different base station, which is not shown), or data received from the access terminal 604 (or a different base station, which is not shown), and/or any other suitable information related to execution of various operations and functions in this specification. The processor 614 may be further coupled to a Polar code encoder 618 and a rate matching apparatus 620.

According to an aspect of this embodiment of the present invention, the rate matching apparatus 620 may be configured to divide a system Polar code output by the Polar code encoder 618 into system bits and parity bits; interleave the system bits to obtain a first group of interleaved bits (Set1), and interleave the parity bits to obtain a second group of interleaved bits (Set2); and determine a rate-matched output sequence based on the first group of interleaved bits and the second group of interleaved bits.

According to this embodiment of the present invention, system bits and parity bits are separately interleaved, to obtain a rate-matched output sequence, so that a sequence structure after interleaving is more random, which can reduce an FER, thereby improving HARQ performance, and ensuring reliability of data transmission.

In addition, because impacts of interleaving processing on minimum distances of the system bits and the parity bits are different, when the system bits and the parity bits are separately interleaved, minimum distances of the interleaved bits can be further increased, thereby improving rate matching performance of the Polar code.

According to another aspect of this embodiment of the present invention, the rate matching apparatus 620 may be configured to perform integral interleaving on a non-system Polar code output by the Polar code encoder 618 to obtain interleaved bits, and determine a rate-matched output sequence based on the interleaved bits.

In this embodiment of the present invention, integral interleaving is performed on a non-system Polar code, and a minimum distance of interleaved bits is increased, thereby improving rate matching performance of the Polar code.

A type of the interleaving processing performed by the rate matching apparatus 620 is not limited in this embodiment of the present invention. For example, quadratic (Quadratic) interleaving may be performed.

For a case in which N is an integer power of 2, a function is defined:

$$c(m) = \frac{km(m+1)}{2} (\bmod N),$$

where K is an odd number, and $0 \leq m < N$; and a mapping function of the Quadratic interleaving is: c(m) a c(m+1) (mod N) $0 \leq m < N$. In other words, the $c(m)^{th}$ bit is mapped onto the $c(m+1)(\bmod N)^{th}$ bit in interleaved bits. Herein mod is a modulo operation.

Optionally, in an embodiment, when interleaving the system bits to obtain the first group of interleaved bits, the rate matching apparatus 620 may perform quadratic (Quadratic) interleaving on the system bits to obtain the first group of interleaved bits.

Optionally, in another embodiment, when interleaving the parity bits to obtain the second group of interleaved bits, the rate matching apparatus 620 may perform quadratic (Quadratic) interleaving on the parity bits to obtain the second group of interleaved bits.

Optionally, in another embodiment, when determining the rate-matched output sequence based on the first group of interleaved bits and the second group of interleaved bits, the rate matching apparatus 620 may use a circular buffer. Specifically, first, the rate matching apparatus 620 may sequentially write the first group of interleaved bits and the second group of interleaved bits to the circular buffer, that is, the first group of interleaved bits is first written to the circular buffer, and then the second group of interleaved bits is written to the circular buffer. Then the rate matching apparatus 620 may determine a start position of the rate-matched output sequence in the circular buffer according to a redundancy version, and read bits from the circular buffer according to the start position as the rate-matched output sequence.

In an HARQ process of the Polar code, the system bits and the parity bits are different in importance, and specifically, the system bits are more important than the parity bits. It is assumed that the first group of interleaved bits obtained by interleaving the system bits is Set1, and the second group of interleaved bits obtained by interleaving the parity bits is Set2. Set1 is written to the circular buffer before Set2, so that more system bits may be retained in the rate-matched output sequence, so as to improve HARQ performance of the Polar code.

Optionally, in another embodiment, when determining the rate-matched output sequence based on the first group of interleaved bits and the second group of interleaved bits, the rate matching apparatus 620 may sequentially combine the first group of interleaved bits (Set1) and the second group of interleaved bits (Set2) into a third group of interleaved bits (Set3), that is, in Set3, all bits in Set1 are located before all bits in Set2. Then the rate matching apparatus 620 may sequentially clip or repeatedly extract bits from Set3 to obtain the rate-matched output sequence required in each time of retransmission. For example, when a length La of bits that need to be retransmitted is shorter than a length Lb of Set3, some bits whose length is La are clipped from Set3 as the rate-matched output sequence. For another example, when a length La of bits that need to be retransmitted is longer than a length Lb of Set3, after all bits in Set3 are read, the bits in Set3 may be read second time from the beginning, which is repeated until the rate-matched output sequence whose length is La is read.

In an HARQ process of a Polar code, system bits and parity bits are different in importance, and specifically, the system bits are more important than the parity bits. Therefore, a first group of interleaved bits Set1 obtained by interleaving the system bits is located before a second group of interleaved bits Set2 obtained by interleaving the parity bits, which are combined into a third group of interleaved bits Set3, so that more system bits may be remained in a rate-matched output sequence that is obtained finally, thereby improving HARQ performance of the Polar code.

Optionally, in an embodiment, when performing integral interleaving on a non-system Polar code to obtain interleaved bits, the rate matching apparatus 620 may perform quadratic (Quadratic) interleaving on the non-system Polar code to obtain the interleaved bits.

Optionally, in another embodiment, when determining the rate-matched output sequence based on the interleaved bits, the rate matching apparatus 620 may write the interleaved bits to the circular buffer, determine a start position of the rate-matched output sequence in the circular buffer according to a redundancy version, and read the rate-matched output sequence from the circular buffer according to the start position.

Optionally, in another embodiment, when determining the rate-matched output sequence based on the interleaved bits, the rate matching apparatus 620 may sequentially clip or repeatedly extract bits from the interleaved bits, so as to obtain the rate-matched output sequence required in each time of retransmission.

In addition, in the system 600, a modulator 622 may multiplex a frame, so that the transmitter 624 sends information to the access terminal 604 by using the antenna 608. Although it is shown that the Polar code encoder 618, the rate matching apparatus 620, and/or the modulator 622 is separated from the processor 614, it may be understood that the Polar code encoder 618, the rate matching apparatus 620, and/or the modulator 622 may be a part of the processor 614 or multiple processors (which are not shown).

It may be understood that the embodiments described in this specification may be implemented by hardware, software, firmware, middleware, microcode, or a combination thereof. For implementation by hardware, a processing unit may be implemented in one or more ASICs (Application Specific Integrated Circuits, application specific integrated circuits), DSPs (Digital Signal Processing, digital signal processors), DSPDs (DSP Devices, digital signal processing devices), PLDs (Programmable Logic Devices, programmable logic devices), FPGAs (Field-Programmable Gate Arrays, field-programmable gate arrays), processors, controllers, micro-controllers, microprocessors, other electronic units for performing the functions in this application, or a combination thereof.

When the embodiments are implemented in software, firmware, middleware, microcode, program code, or a code segment, they may be stored in, for example, a machine-readable medium of a storage component. The code segment may indicate a process, a function, a subprogram, a program, a routine, a subroutine, a module, a software group, a type, or any combination of an instruction, a data structure, and a program statement. The code segment may be coupled to another code segment or a hardware circuit by transferring and/or receiving information, data, an independent variable, a parameter, or memory content. The information, the independent variable, the parameter, the data, or the like may be transferred, forwarded, or sent in any suitable manner such as memory sharing, message transfer, token transfer, or network transmission.

For implementation by software, the technologies in this specification may be implemented by executing the functional modules (for example, a process and a function) in this specification. Software code may be stored in a memory unit and executed by a processor. The memory unit may be implemented inside the processor or outside the processor, and in the latter case, the memory unit may be coupled to the processor by means of communication by using various means known in the art.

Figure 7:
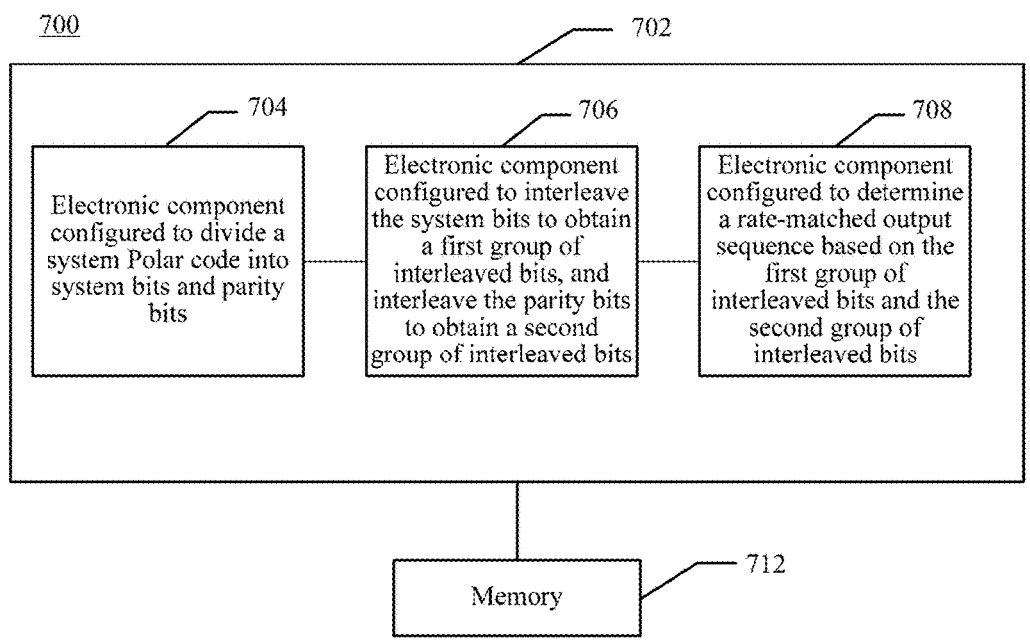
FIG. 7 shows a system that can use a Polar code rate matching method in a wireless communications environment.

Refer to FIG. 7, which shows a system 700 that can use a Polar code rate matching method in a wireless communications environment. For example, the system 700 may at least partially reside within a base station. According to another example, the system 700 may at least partially reside within an access terminal. It should be understood that the system 700 may be indicated as including a functional block, which may indicate a functional block of a function implemented by a processor, software, or a combination thereof (for example, firmware). The system 700 includes a logical group 702 having electronic components that jointly perform an operation.

For example, the logical group 702 may include an electronic component 704 configured to divide a system Polar code into system bits and parity bits, and an electronic component 706 configured to interleave the system bits to obtain a first group of interleaved bits, and interleave the parity bits to obtain a second group of interleaved bits. The logical group 702 may further include an electronic component 708 configured to determine a rate-matched output sequence based on the first group of interleaved bits and the second group of interleaved bits.

According to this embodiment of the present invention, system bits and parity bits are separately interleaved, to obtain a rate-matched output sequence, so that a sequence structure after interleaving is more random, which can reduce an FER, thereby improving HARQ performance, and ensuring reliability of data transmission.

In addition, because impacts of interleaving processing on minimum distances of the system bits and the parity bits are different, when the system bits and the parity bits are separately interleaved, minimum distances of the interleaved bits can be further increased, thereby improving rate matching performance of the Polar code.

In addition, the system 700 may include a memory 712, where the latter stores instructions for performing functions related to the electronic components 704, 706, and 708. Although it is shown that the electronic components 704, 706, and 708 are outside the memory 712, it may be understood that one or more of the electronic components 704, 706, and 708 may exist inside the memory 712.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present invention essentially, or the part contributing to the prior art, or some of the technical solutions may be implemented in a form of a software product. The computer software product is stored in a storage medium, and includes several instructions for instructing a computer device (which may be a personal computer, a server, or a network device) to perform all or some of the steps of the methods described in the embodiments of the present invention. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A polar code rate matching method, comprising:
    obtaining, by a wireless communication apparatus, a system polar code by encoding data to be transferred, wherein the system polar code corresponds to a generator matrix;
    dividing, by the wireless communication apparatus, the system polar code into system bits and parity bits, wherein the system bits correspond to a unit matrix part in the generator matrix and the parity bits correspond to a check matrix part in the generator matrix;
    performing, by the wireless communication apparatus, quadratic interleaving on the system bits to obtain a first group of interleaved bits, and quadratic interleaving on the parity bits to obtain a second group of interleaved bits, wherein a mapping function of the quadratic interleaving is $c(m) \mapsto c(m+1)$ (mod N) $0 \leq m < N$, such that a $c(m)^{th}$ bit before interleaving is mapped onto a $c(m+1)(\bmod N)^{th}$ bit after interleaving; and
    determining, by the wireless communication apparatus, a rate-matched output sequence based on the first group of interleaved bits and the second group of interleaved bits, wherein determining the rate-matched output sequence based on the first group of interleaved bits and the second group of interleaved bits further comprises:
        sequentially combining the first group of interleaved bits and the second group of interleaved bits into a third group of interleaved bits, wherein the first group of interleaved bits precedes the second group of interleaved bits in the third group of interleaved bits; and
        sequentially clipping or repeatedly extracting bits from the third group of interleaved bits to obtain the rate-matched output sequence based on whether a length of the third group of interleaved bits is longer or shorter than a length of bits to be retransmitted, respectively;
    wherein obtaining the rate-matched output sequence by sequentially clipping bits from the third group of interleaved bits when the length of the third group of interleaved bits is longer than the length of bits to be retransmitted comprises: clipping a sequence of bits from the third group of interleaved bits having a length equal to the length of bits to be retransmitted; and
    wherein obtaining the rate-matched output sequence by repeatedly extracting bits from the third group of interleaved bits when the length of the third group of interleaved bits is shorter than the length of bits to be retransmitted comprises: repeatedly reading a sequence of bits from the third group of interleaved bits until a number of read bits equals the length of bits to be retransmitted.

2. A wireless communication apparatus, comprising a processor and a non-transitory memory having processor-executable instructions stored thereon, wherein the processor-executable instructions, when executed by the processor, facilitate performance of the following:
    obtaining a system polar code by encoding data to be transferred, wherein the system polar code corresponds to a generator matrix;
    dividing the system polar code output into system bits and parity bits, wherein the system bits correspond to a unit matrix part in the generator matrix and the parity bits correspond to a check matrix part in the generator matrix;
    performing quadratic interleaving on the system bits to obtain a first group of interleaved bits, and quadratic interleaving on the parity bits to obtain a second group of interleaved bits, wherein a mapping function of the quadratic interleaving is $c(m) \mapsto c(m+1)$ (mod N) $0 \leq m < N$, such that a $c(m)^{th}$ bit before interleaving is mapped onto a $c(m+1)(\bmod N)^{th}$ bit after interleaving; and
    determining a rate-matched output sequence based on the first group of interleaved bits and the second group of interleaved bits, wherein determining the rate-matched output sequence based on the first group of interleaved bits and the second group of interleaved bits further comprises:
        sequentially combining the first group of interleaved bits and the second group of interleaved bits into a third group of interleaved bits, wherein the first group of interleaved bits precedes the second group of interleaved bits in the third group of interleaved bits; and
        sequentially clipping or repeatedly extracting bits from the third group of interleaved bits to obtain the rate-matched output sequence based on whether a length of the third group of interleaved bits is longer or shorter than a length of bits to be retransmitted, respectively;
    wherein obtaining the rate-matched output sequence by sequentially clipping bits from the third group of interleaved bits when the length of the third group of interleaved bits is longer than the length of bits to be retransmitted comprises: clipping a sequence of bits from the third group of interleaved bits having a length equal to the length of bits to be retransmitted; and
    wherein obtaining the rate-matched output sequence by repeatedly extracting bits from the third group of interleaved bits when the length of the third group of interleaved bits is shorter than the length of bits to be retransmitted comprises: repeatedly reading a sequence of bits from the third group of interleaved bits until a number of read bits equals the length of bits to be retransmitted.

* * * * *